United States Patent
Chapman et al.

(10) Patent No.: US 7,345,946 B1
(45) Date of Patent: Mar. 18, 2008

(54) DUAL-VOLTAGE WORDLINE DRIVE CIRCUIT WITH TWO STAGE DISCHARGE

(75) Inventors: David Chapman, Shelburne, VT (US); Anupam Arora, Essex Junction, VT (US); Lin Ma, West Orange, NJ (US); Richard Parent, Shelburne, VT (US)

(73) Assignee: Cypress Semiconductor Corporation, San Jose, CA (US)

( * ) Notice: Subject to any disclaimer, the term of this patent is extended or adjusted under 35 U.S.C. 154(b) by 73 days.

(21) Appl. No.: 11/234,028

(22) Filed: Sep. 23, 2005

Related U.S. Application Data

(60) Provisional application No. 60/613,174, filed on Sep. 24, 2004.

(51) Int. Cl.
*G11C 8/00* (2006.01)

(52) U.S. Cl. ............... 365/230.06; 365/189.11

(58) Field of Classification Search ............ 365/230.06
See application file for complete search history.

(56) References Cited

U.S. PATENT DOCUMENTS

| 5,668,485 | A |   | 9/1997  | Rountree      |            |
|-----------|---|---|---------|---------------|------------|
| 5,737,267 | A | * | 4/1998  | Proebsting    | 365/189.01 |
| 5,761,148 | A |   | 6/1998  | Allan et al.  |            |
| 5,774,413 | A |   | 6/1998  | Hunt          |            |
| 5,808,500 | A |   | 9/1998  | Kalpakjian    |            |
| 5,864,507 | A |   | 1/1999  | Hawkins et al.|            |
| 5,936,894 | A |   | 8/1999  | Hawkins et al.|            |
| 6,049,503 | A |   | 4/2000  | Khang         |            |
| 6,067,257 | A | * | 5/2000  | Kitsukawa et al. | 365/189.11 |
| 6,088,289 | A |   | 7/2000  | Landry et al. |            |
| 6,288,603 | B1| * | 9/2001  | Zanuccoli et al. | 327/544 |
| 6,333,891 | B1|   | 12/2001 | Landry et al. |            |
| 6,590,420 | B1|   | 7/2003  | Mnich et al.  |            |
| 6,614,070 | B1|   | 9/2003  | Hirose et al. |            |
| 6,621,745 | B1| * | 9/2003  | Manea         | 365/185.23 |
| 6,654,309 | B1|   | 11/2003 | Hirose        |            |
| 6,801,064 | B1|   | 10/2004 | Hunt et al.   |            |
| 6,999,373 | B2|   | 2/2006  | Abedifard     |            |
| 2003/0222678 | A1| * | 12/2003 | Sun         | 326/68     |
| 2003/0235100 | A1| * | 12/2003 | Pascucci    | 365/203    |

OTHER PUBLICATIONS

U.S. Appl. No. 10/799,742, Parent et al.

* cited by examiner

*Primary Examiner*—Amir Zarabian
*Assistant Examiner*—Jason Lappas
(74) *Attorney, Agent, or Firm*—Haverstock & Owens, LLP

(57) ABSTRACT

A wordline driver circuit can include single stage level shifters to translate a low voltage level (VGND to Vcc) to a high voltage level (Vnwl to Vpp). A wordline driver can further include a two-stage discharge circuit to pull down a wordline from a boosted high voltage Vpp to a boosted low voltage Vnwl. A two-stage discharge circuit can include (i) a first discharge path that can pull the wordline toward a first low voltage VGND; and (ii) a second discharge path that can pull the wordline toward a lower boosted low voltage Vnwl. Initially discharging a wordline to a first low voltage can reduce the amount of charge injected into a boosted low voltage Vnwl supply. A two-stage discharge circuit can be self timed or externally timed.

10 Claims, 8 Drawing Sheets

US 7,345,946 B1

DUAL-VOLTAGE WORDLINE DRIVE CIRCUIT WITH TWO STAGE DISCHARGE

This application claims the benefit of U.S. Provisional Patent Application Ser. No. 60/613,174, filed on Sep. 24, 2004.

TECHNICAL FIELD

The present invention relates generally to memory devices, and more particularly to dual voltage word line driver circuits for memory device, such as dynamic random access memories (RAMs) and methods for operating the same.

BACKGROUND OF THE INVENTION

Random access memory (RAM) devices, such as dynamic RAMs (DRAMs), typically include a memory array of DRAM cells accessed via wordlines (e.g., in a row direction) and bit lines (e.g., in column direction). A typical DRAM cell includes a pass transistor and a storage capacitor. In a read operation, the pass transistor (e.g., transfer device) is turned on according the voltage of a wordline to enable the transfer (i.e., sharing) of charge on a corresponding bit line. For high performance and/or compact array design, a pass transistor is typically an n-channel insulated gate field effect transistor (i.e., NFET).

For efficient DRAM operation, a word line voltage is often driven to a "boosted" voltage. A boosted voltage can be a level higher than a supply voltage to the DRAM device or DRAM array. A boosted voltage can ensure that there is virtually no threshold drop introduced by a pass transistor as charge is transferred from a selected DRAM cell to a bit line.

In smaller dimension technologies, to decrease access time, a threshold voltage (Vt) of the transfer device within a memory cell can be reduced and/or the thickness of the transfer gate dielectric can be reduced. This can allow for lower boosted wordline voltages. However, such an arrangement can increase a sub-threshold leakage of a transfer device. A sub-threshold leakage can be the leakage that occurs even though the transfer device is (or is meant to be) turned off. Increased sub-threshold leakage can deplete charge from the storage capacitor of a DRAM cell and hence negatively impacts data retention time.

To address increased sub-threshold leakage, a transfer device off voltage can be increased. For example, in the case of an NFET, a low wordline voltage can be driven to a voltage below a low power supply (e.g., ground) level.

Therefore, in order to provide efficient data transfer and faster access times, a wordline driver circuit can drive a corresponding wordline to a boosted positive voltage (Vpp) to access a memory cell and boosted negative voltage (Vnwl) to isolate a memory cell.

Generally, providing boosted voltage levels can entail an equivalent charge reservoir for both a Vpp level and Vnwl level in order to supply the instantaneous charge source or sink needed to activate (e.g., drive to Vpp) and de-activate (e.g., drive to Vnwl) the wordline.

To better understand various aspects of the disclosed embodiments, a conventional DRAM wordline driver will be described with reference to FIG. 9.

Referring to FIG. 9, a conventional wordline driver circuit 900 can include a dynamic high voltage NAND decoder 902 connected to a keeper half-latch 904. It is noted that these two circuit sections (902 and 904) operate a boosted high voltage Vpp. These circuit sections can be followed by boosted level inverters 906 and 908. Boosted inverters (906 and 908) can operate between the boosted levels, driving output signals between a boosted high voltage Vpp and a boosted low voltage Vnwl.

A final stage of wordline driver 900 can include a decoded driver 910. Decoded driver 910 can include a p-channel insulated gate field effect transistor (i.e., PFET) P1 with a source driven by a decoded boosted high voltage DRV_Vpp, and an NFET N1 having a source coupled to the boosted low voltage Vnwl. In addition, a keeper NFET N2 can dynamically maintain the wordline (WL) at the boosted low voltage Vnwl, when not selected via the source of P1.

While the conventional arrangement of FIG. 9 represents an improvement over previous architectures that did not provide a wordline voltage driven to a boosted low voltage, the arrangement can have a number of drawbacks or disadvantages. First, a wordline driver 900 includes a dynamic NAND precharge PFET P2 that drives a decoder node ND1 to a boosted high voltage Vpp. As a result, when multiple wordline drivers are cycled to a precharge state (signal PRECH low), multiple nodes ND1 are driven to boosted high voltage Vpp, which can cause a large current spike on a Vpp supply.

Further, as a wordline is discharged to a boosted low (Vnwl) level, a significant current spike for such a supply can be created. This can cause a Vnwl supply to "bounce" (rise above its intended level). This can cause sub-threshold leakage in transfer devices that should otherwise be maintained in the fully off state.

Still further, in order to accommodate large voltage spikes at both boosted levels, a DRAM device may have to be supplied with a relatively large decoupling capacitor to both a boosted high voltage Vpp, as well as a boosted low voltage Vnwl.

Accordingly, there is a need for a wordline driver that can drive a wordline between boosted high and low voltages that can reduce active current spikes on boosted supplies.

More particularly, it would be desirable to arrive at some way of reducing a current spike on a boosted high supply (e.g., Vpp) when dynamic decoders of wordline drivers are commonly activated in response to a precharge operation.

It would also be desirable to arrive at some way of reducing a bounce in a boosted low supply resulting from current spikes caused by discharging wordlines to such a boosted low supply voltage.

It is also desirable to arrive at a wordline driver that can essentially eliminate the need for relatively large decoupling capacitors for a boosted low voltage and boosted high voltage.

SUMMARY OF THE INVENTION

The present invention can include a memory device circuit having a number of wordlines, each wordline having a plurality of volatile memory cells coupled thereto. The memory device circuit can also includes a plurality of level shift circuits, one level shift circuit coupled to one corresponding wordline. Each level shift circuit can translate an input signal at a decode node that transitions between a first high voltage level and a first low voltage level to an output signal that transitions between a second high voltage level and second low voltage level. The second high voltage can be a "boosted" voltage that is higher than the first high voltage. The second low voltage can be a "boosted" voltage that is lower than the first low voltage.

In this way, level shifting can be performed in a wordline by wordline basis, enabling decoding operations for wordline selection, particularly dynamic decoding, to occur at a lower voltage. This can reduce current spikes on a boosted voltage supplies as compared to conventional approaches that decode based on boosted voltage levels.

According to one aspect of the embodiments, each level shift circuit can include a high level shift section that receives the second high voltage level and the first low voltage level. The high level shift section can translates the input signal to the second high voltage level. In addition, a low level shift section can receive a first high voltage level and the second low voltage level, and can translate the input signal to the second low voltage level.

According to another aspect of the embodiments, each high level shift section can include cross coupled first and second translator p-channel insulated gate field effect transistors (PFETs), each having a source coupled to the second high voltage level. The drain of the second translator PFET can be coupled to a translator output node that provides the translated select signal.

In this arrangement, a high level shift section can enable the output node to be driven to a boosted high voltage.

According to another aspect of the embodiments, each low level shift section can include cross coupled first and second translator n-channel insulated gate field effect transistors (NFETs), each having a source coupled to the second low voltage level. The drain of the second translator NFET being coupled to the translator output node.

In this arrangement, a low level shift section can enable the output node to be driven to a boosted low voltage.

According to another aspect of the embodiments, each volatile memory cell can include a dynamic random access memory (DRAM) cell having an n-channel insulated gate field effect transistor having a gate coupled to a corresponding wordline and a source coupled to a storage capacitor.

In this way, a boosted high voltage can enable efficient transfer of charge from such memory cells, while a boosted low voltage can enable the suppression of sub-threshold leakage in such cells.

According to another aspect of the embodiment, a memory device circuit can also include a discharge circuit coupled to each wordline. Each discharge circuit can include a first discharge path that provides a first current path between at least one wordline and the first low voltage level. A second discharge path can provide a second current path between the at least one wordline and the second low voltage level. The second current path can be enabled after the first discharge path is enabled, in a precharge operation.

In this way, wordlines can be discharged in a two-stage operation. Such an arrangement can advantageously reduce current spikes in the boosted low voltage supply by first discharging wordline charge to a supply level.

According to another aspect of the embodiments, a first discharge path can include a first discharge transistor and second discharge transistor. The first discharge transistor can have a source-drain path coupled between the at least one wordline and the first low voltage level. A gate of the transistor can be coupled to receive a boosted select signal. The second discharge transistor can have a source-drain path coupled in series with the source-drain path of the first discharge transistor between the at least one wordline and the first low voltage level. A gate of the transistor can be coupled to the at least one wordline.

In this way, a first discharge path can include a second discharge transistor having a "diode" connection with respect to the wordline. The current path of the second transistor can be enabled by a first transistor that is turned on when the wordline is deselected. Such an arrangement can result in a self-timed discharge operation, which can result in the need for fewer control signals and/or a more compact circuit design.

The present invention can also include a second discharge path having a boost discharge transistor with a source-drain path coupled between the at least one wordline and the second low voltage level. A discharge driver (e.g., inverter) can have an input coupled to the at least one wordline and an output coupled to the gate of the boost discharge transistor. The discharge driver can drive a gate of the boost discharge transistor between the second high voltage level and second low voltage.

In this way, the operation of a second discharge path can also be self-timed, enabling discharge according to a wordline potential.

According to another aspect of the embodiments, first and/or second discharge paths can be controlled according to timing signals. For example, a second discharge transistor within a first discharge path can have a gate coupled to receive a first discharge signal. Similarly, a boost discharge transistor within a second discharge path can have a gate coupled to receive a second discharge signal that is activated after the first discharge signal in a precharge operation.

In this way, the operation of either or both the first and a second discharge paths can be based on timing signals (as opposed to self-timed).

As but one example, and according to another aspect of the embodiments, a memory device circuit can include a clock circuit that receives an external timing signal and generates the first discharge signal and second discharge signal in response to the external timing signal.

In this way, two-stage wordline discharge can be timed according to an external clock signal. Such an arrangement may be advantageously implemented in a synchronous memory device.

The present invention can also include a method of reducing current consumption in a memory device having a plurality of wordlines. The method can include selecting a wordline by coupling the selected wordline to a boosted high voltage, and de-selecting the wordline by coupling the selected wordline to a low voltage. Subsequently, the selected wordline can be coupled to a boosted low voltage that is lower in potential than the low voltage.

According to one aspect of the embodiments, coupling the selected wordline to the boosted high voltage can include driving a source of a first driver transistor with the boosted high voltage and providing an enabling signal to the gate of the first driver transistor.

In this way, a wordline can be driven high by driven signal at the drain of a driver transistor, such as by a decoded boost signal.

According to another aspect of the embodiments, coupling the selected wordline to the low voltage can include enabling a first discharge transistor coupled between the selected wordline and the low voltage in response to the potential of the selected wordline. Coupling the selected wordline to the boosted low voltage can include enabling a second discharge transistor coupled between the selected wordline and the boosted low voltage in response to the potential of the selected wordline.

According to another aspect of the embodiments, coupling the selected wordline to the low voltage can include enabling a first discharge transistor coupled between the selected wordline and the low voltage in response to a first signal generated in response to an external timing signal. Coupling the selected wordline to the boosted low voltage can include enabling a second discharge transistor coupled between the selected wordline and the boosted low voltage in response to a second signal generated in response to the external timing signal.

According to another aspect of the embodiments, selecting a wordline can further include driving a low voltage select node between the low voltage and a high voltage, and translating the potential at the select node into a high voltage select signal that varies between the boosted low voltage and a boosted high voltage that greater than the high voltage.

The present invention can also include a semiconductor memory device that includes a plurality of wordlines and a two-stage discharge circuit coupled to each wordline. Each two stage discharge circuit can include a first discharge device that couples the wordline to a first discharge node, and a second discharge device that couples the wordline to a second discharge node that operates at a different potential than the first discharge node.

According to another aspect of the embodiments, a driver circuit can be coupled to each wordline. Each driver circuit can include at least a first driver device that couples the wordline to a boosted high voltage and has a control terminal coupled to receive a high voltage select signal. In addition, a two stage discharge circuit can further include a third discharge device coupled in series with the first discharge device between the first discharge node and the wordline. A control terminal of the third discharge device can be coupled to receive the high voltage select signal.

According to another aspect of the embodiments, first, second and third discharge devices can comprise n-channel insulated gate field effect transistors.

According to another aspect of the embodiments, wordlines have a pitch with respect to one another. In addition, one level shift circuit can be coupled to each wordline, situated within a pitch of the wordline. Each level shift circuit can receive a low voltage input signal from a low voltage decoder coupled between a first supply node and the first discharge node. In addition, each level shift circuit can drive an output node between a second supply node that operates at a different potential than the first supply node and the second discharge node according to the low voltage input signal.

In this way, level shifting can be provided "on-pitch".

DETAILED DESCRIPTION

The various embodiments of the present invention are directed to an architecture and/or circuit for a wordline driver in a memory device, such as a dynamic random access memory (DRAM). For purposes of clarity, many of the details of RAMs and wordline drivers that are widely known and are not relevant to the present invention have been omitted from the following description.

Figure 1A:
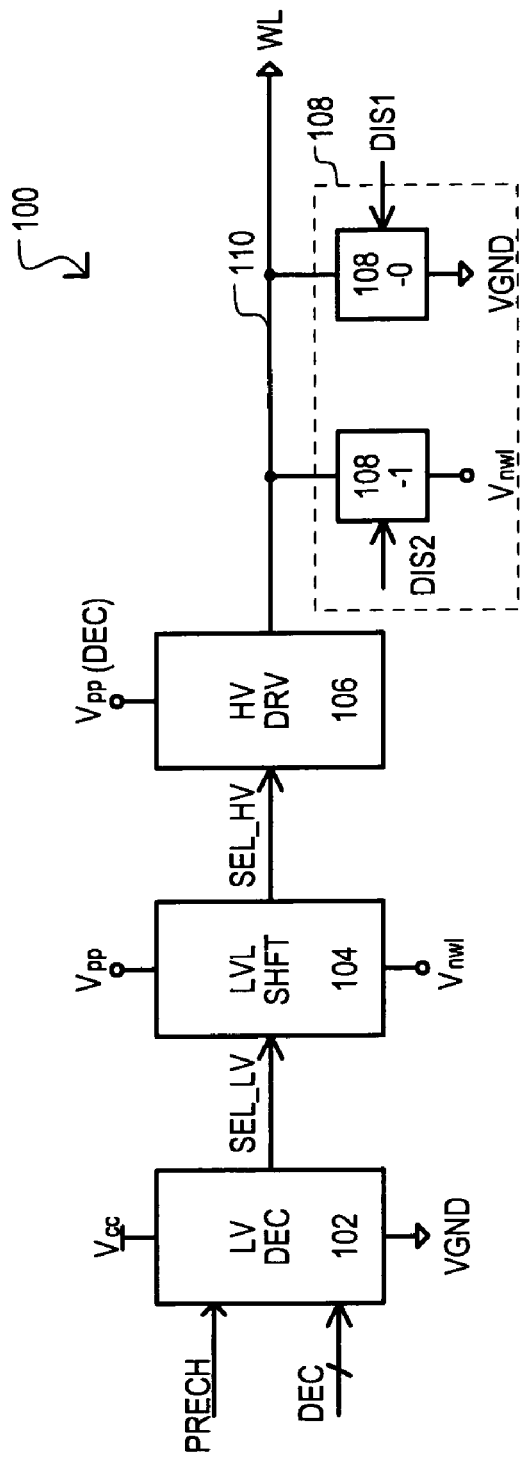
FIG. 1A is a block schematic diagram of a wordline driver circuit according to a first embodiment of the present invention.

Referring now to FIG. 1A, a wordline driver circuit according to a first embodiment is set forth in a block schematic diagram and designated by the general reference character 100. A wordline driver circuit 100 can be repeated in a memory device having volatile memory cells, such as DRAM cells, to form a memory device architecture. The wordline driver circuit 100 can include a low voltage decoder 102, a level shift circuit 104, a high voltage driver 106, and a two stage discharge circuit 108.

A low voltage decoder 102 can receive a first high voltage (Vcc) and a first low voltage VGND. In response to a precharge signal PRECH and decode signals DEC, a low voltage decoder 102 can output a low voltage select signal SEL_LV that can vary between levels Vcc and GND.

A level shift circuit 104 can receive a boosted high voltage Vpp and a boosted low voltage Vnwl. It is understood that a boosted high voltage Vpp can be higher than a supply voltage Vcc, and a boosted low supply voltage Vnwl can be lower than a first low voltage VGND. In response to low voltage select signal SEL_LV, level shift circuit can provide a high voltage select signal SEL_HV can vary between levels Vpp and Vnwl.

In this way, a precharge operation can drive nodes within a low voltage decoder 102 to a voltage Vcc, and thus not introduce a current spike into the supply of a boost high voltage Vpp, as can occur in conventional arrangements.

A high voltage driver 106 can receive a boost high voltage Vpp, and can drive word line 110 to a boost high voltage Vpp when the wordline 110 is selected. As will be shown in more detail below, a boost high voltage Vpp supplied to driver 106 can be decoded supply, hence the (DEC) designation. A decoded supply, in contrast to a non-decoded supply can be driven to the indicated voltage in response to decode signals. In particular embodiments, such decoded supply signals can be generated in response to an applied address.

A wordline driver circuit 100 can further include a two-stage discharge circuit 108. A two-stage discharge circuit 108 can include a first discharge path 108-0 to the first low voltage VGND and a second discharge path 108-1 to a boost low voltage Vnwl. In such an arrangement, when a wordline 110 is discharged from about a Vpp level (due to a precharge operation, for example), initial discharging occurs via first discharge path 108-0 to low voltage VGND. Subsequently, discharging can occur via the second discharge path 108-1 to boosted low voltage Vnwl. First discharge path 106-0 and second discharge path 106-1 can be enabled in response to inputs DIS1 and DIS2, respectively.

In this way, when a wordline 110 is deselected (for example in a precharge operation), it can be driven to a boosted low voltage Vnwl to advantageously reduce sub-threshold leakage. However, because charge is initially discharged to low voltage VGND, such an operation may not introduce a current spike into the supply of a boosted low voltage Vnwl.

Preferably, the circuit of FIG. 1A can be repeated, with having a given pitch with respect to one another. Further, circuit components of FIG. 1 can fit within such a pitch.

Figure 1B:
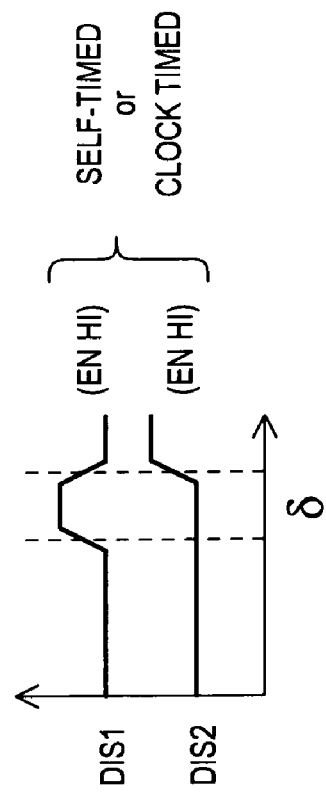
FIG. 1B is a timing diagram illustrating the activation of discharge paths in a wordline driver circuit according to embodiments of the present invention.

As shown in FIG. 1B, a second discharge path 108-1 can be enabled after the first discharge path 108-0. As will be described in more detail below, the enabling of first and second discharge paths 106-0 and 106-1 can be self-timed, or can be timed according to internal clock signals generated in response to an external clock or event.

Figure 2:
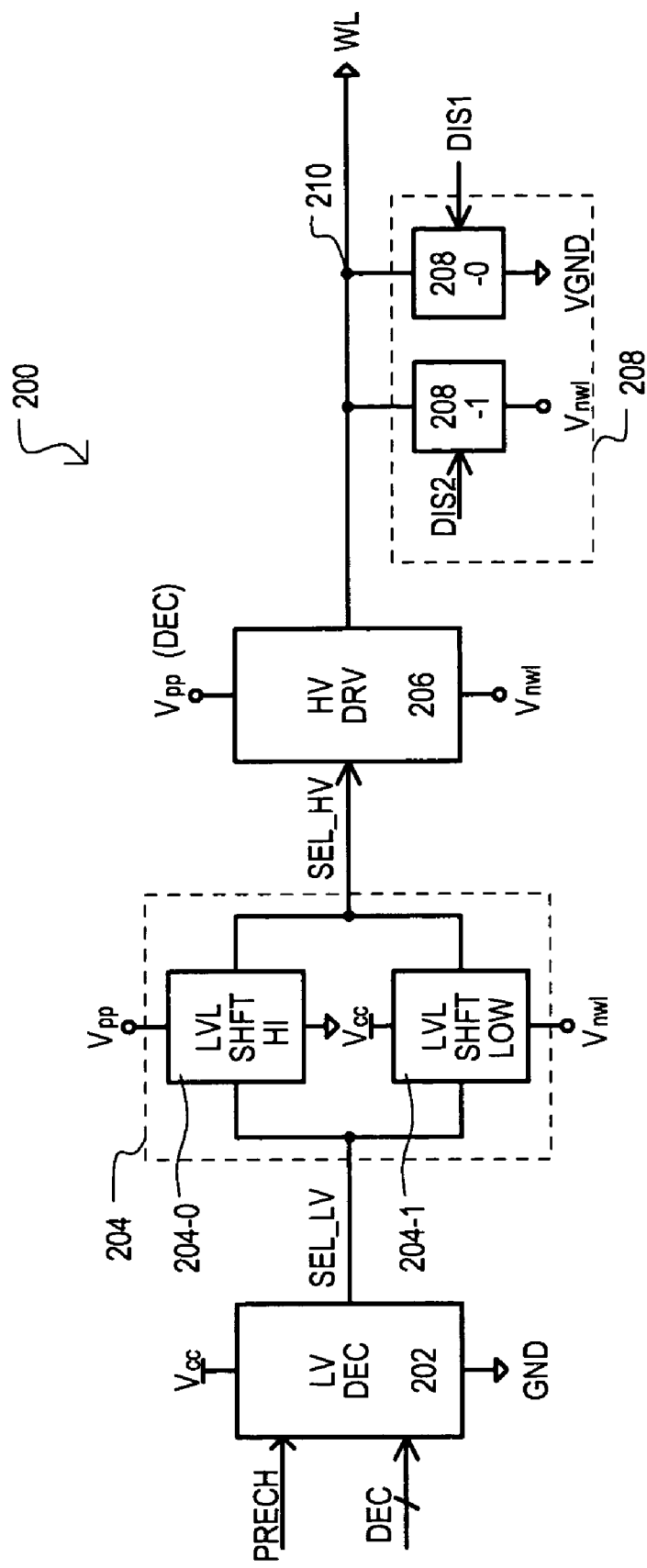
FIG. 2 is a block schematic diagram of a wordline driver circuit according to a second embodiment of the present invention.

Referring now to FIG. 2, a second embodiment of the present invention is set forth in a block schematic diagram and designated by the general reference character 200. A second embodiment 200 can include some of the same general circuit sections as the first embodiment. Such like sections are referred to by the same reference character but with the first digit being a "2" instead of a "1". The embodiment of FIG. 2 can be considered related to the embodiment of FIG. 1, in that it shows one variation in a level shift circuit, like that shown as 104 in FIG. 1.

A level shift circuit 204 of FIG. 2 can include a high level shift section 204-0 and a low level shift section 204-1. A high level shift section 204-0 can receive a boosted high voltage (Vpp) and first low voltage (VGND). A low level shift section 204-1 can receive a first high voltage Vcc and a boosted low voltage (Vnwl). In response to signal SEL_LV (e.g., high), a high level shift section 204-0 can drive a high voltage select signal SEL_HV up to the boosted high voltage Vpp. Similarly, in response to signal SEL_LV (e.g., low), a low level shift section 204-1 can drive a high voltage select signal SEL_HV down to the boosted low voltage Vnwl.

As in the case of FIG. 1A, the circuit components of FIG. 2 can fit within a wordline pitch.

In this way, a voltage translation can be provided for low voltage signal (e.g., SEL_LV), to provide a signal (e.g., SEL_HV) that can vary between both a boosted high voltage and a boosted low voltage. The boosted high voltage can allow for efficient transfer of charge from a memory cell, while the boosted low voltage can allow for reduction of sub-threshold leakage.

Figure 3:
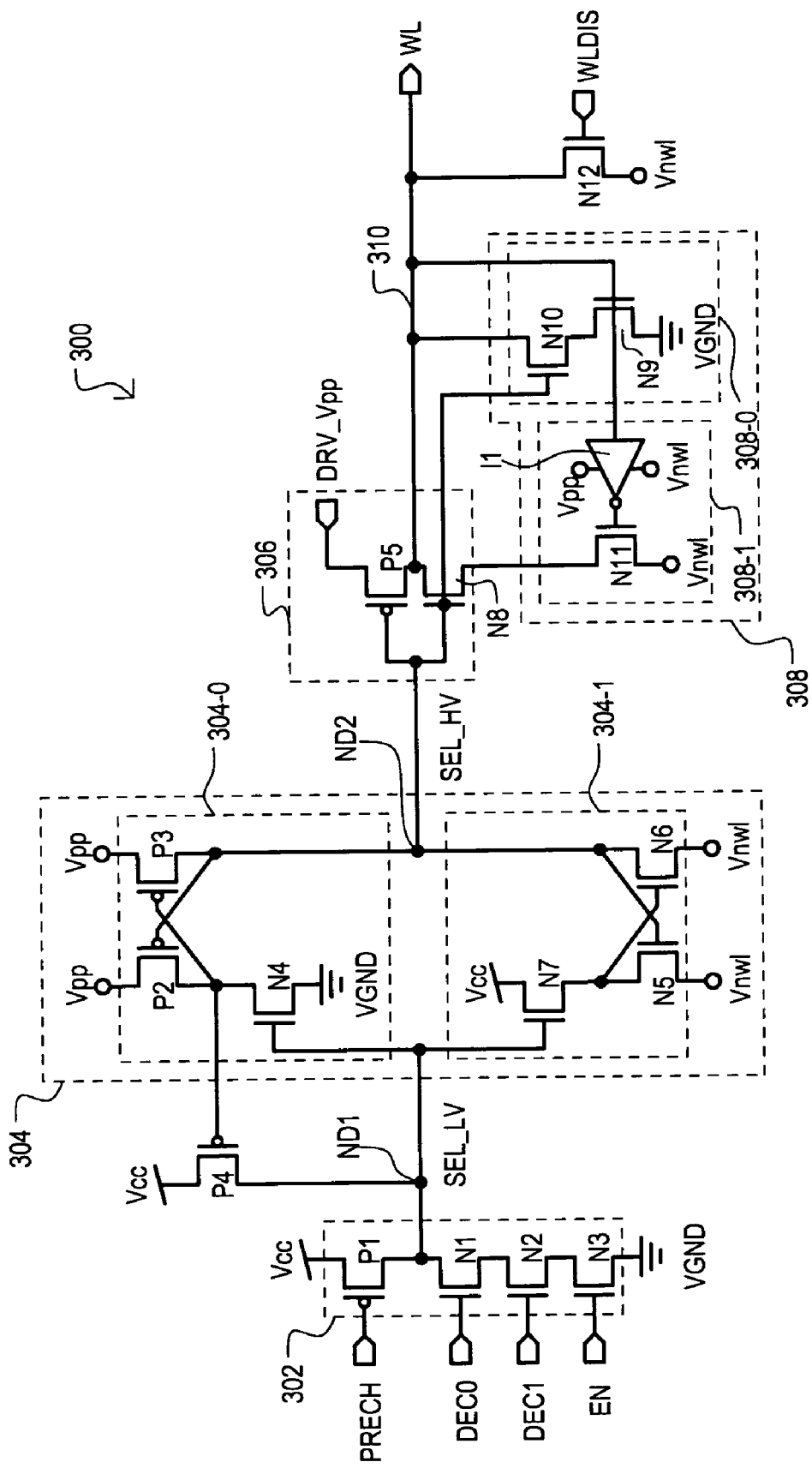
FIG. 3 is a block schematic diagram of a wordline driver circuit according to a third embodiment of the present invention.

Referring now to FIG. 3, a third embodiment of the present invention is set forth in a schematic diagram and designated by the general reference character 300. A third embodiment 300 can include some of the same general circuit sections as the second embodiment. Such like sections are referred to by the same reference character but with the first digit being a "3" instead of a "2". The embodiment of FIG. 3 can be considered related to the embodiment of FIG. 2, in that any of the like sections in FIG. 3 can be detailed examples of those shown in FIG. 2.

Referring to FIG. 3, a wordline driver circuit 300 can utilize single stage on-pitch level shifters that can translate an internal core voltage (Vcc to VGND) to a boosted high voltage (Vpp) and boosted low voltage (Vnwl) on a wordline by wordline basis. Such an approach can substantially eliminate the possibility of current spikes from a dynamic precharge signals utilized to prepare decode circuits for decode operations. In addition, such dual voltage translation, on pitch, can reduce the capacitive load on pumped voltages, such as those that supply boosted high and low voltages (Vpp and Vnwl) for predrive and predecode signals. This can advantageously reduce active current Icc and/or standby current Isb.

In the particular arrangement of FIG. 3, a low voltage decoder 302 can be a dynamic NAND gate having a precharge p-channel insulated gate field effect transistor (PFET) P1 and a stack of n-channel insulated gate field effect transistors (N1, N2 and N3). Transistor P1 can receive a precharge signal PRECH at its gate. Transistors N1 and N2 can receive decode signals DEC0 and DEC1 at their respective gates. Transistor N3 can receive an enable signal EN at its gate.

Referring still to FIG. 3, a high level shift section 304-0 of level shifter 304 can include cross-coupled PFETs P2 and P3, as well as input NFET N4. Cross-coupled transistors P2/P3 can have sources commonly connected to a boosted high voltage Vpp. A drain of transistor P2 can be connected to a low voltage VGND by transistor N4. A drain of transistor P3 can be connected to an output node ND2. Input NFET N4 can have a gate connected to input node ND1.

A low level shift section 304-1 of level shifter 304 can include cross-coupled NFETs N5 and N6, as well as input NFET N7. Cross-coupled transistors N5/N6 can have sources commonly connected to a boosted low voltage Vnwl. A drain of transistor N5 can be connected to a high voltage Vcc by input NFET N7. A drain of transistor N6 can be connected to output node ND2. Input NFET N7 can have a gate connected to input node ND1.

The particular example of FIG. 3 also includes a half-latch formed by PFET P4. As is well understood, when node ND1 is high, PFET P4 can function as a "keeper" transistor to help maintain node ND1 at the high voltage Vcc.

A high voltage driver 306 can include a driver PFET P5 and driver NFET N8 having gates commonly connected to node ND2. In the particular arrangement shown, driver PFET P5 can drive wordline 310 to a high level by way of a decoded drive signal DRV_Vpp. Decoded drive signal DRV_Vpp can be driven to the boosted high voltage Vpp in response to predetermined address values. Driver NFET N8 can drive wordline 310 to a low voltage by way of second discharge path 308-1.

Referring still to FIG. 3, pulldown of wordline 310 can be accomplished in two stages utilizing two-stage discharge circuitry 308 split into two discharge paths (308-0 and 308-1). In the particular case of FIG. 3, second discharge path 308-1 can be gated by prior discharge path 308-0. In more detail, a first discharge path 308-0 can include NFETs N9 and N10 having source-drain paths arranged in series between the wordline 310 and first low voltage VGND. A gate of NFET N10 can be connected to node ND2, and a gate of NFET 9 can be connected to wordline 310. In such an arrangement, NFET N9 can be effectively connected in a diode configuration between wordline 310 a first low voltage VGND.

A second discharge path 308-1 can include a high voltage inverter (e.g., driver) I1 and an NFET N11. Inverter I1 can have an input coupled to the wordline 310 and an output coupled to the gate of NFET N11, and can drive its output between boosted high and boosted low voltages (Vnwl-Vpp). NFET N11 can have a source-drain path in series with discharge NFET N8 between wordline 310 and boosted low voltage Vnwl.

When first discharge path 308-0 is activated, it can discharge a boosted wordline voltage (e.g., Vpp) toward first low voltage VGND through the diode connected NFET N9. More particularly, in a precharge or deselect operation, signal SEL_HV at node ND2 can be high (e.g., Vpp), turning on NFET N10. Provided wordline 310 has been charged high, diode connected NFET N9 will be turned on, allowing wordline 310 to be initially discharged toward supply voltage VGND.

As the wordline voltage decreases, NFET N9 can turn off as its gate voltage falls below its threshold voltage. However, discharge may continue toward lower potential Vnwl, as a lower wordline potential can be driven high by inverter I1, resulting in NFET N11 and N8 discharging wordline 310 even lower, and eventually to boosted low voltage Vnwl. In this way, wordline 310 can be discharged fully to Vnwl by a two-stage operation.

The above dual-discharge arrangement can reduce wordline discharge current into a boosted low voltage Vnwl supply, as compared to conventional arrangements, thereby reducing bounce. In addition, the potential of sub-threshold leakage can be reduced if not substantially eliminated for wordlines that are "off" (i.e., de-selected) as de-selected wordlines are driven to the boosted low voltage Vnwl.

Still further, when a wordline is to remain de-selected, NFET N11 can serve as a "keeper" device that continues to maintain the de-selected wordline at the boosted low voltage Vnwl.

In this way, a two-stage discharge can reduces charge injected into a pumped voltage supply (e.g., supply Vnwl), thereby reducing the need to cycle charge pumps and/or reducing active and standby currents.

The embodiment of FIG. 3 also includes a disable device, NFET N12, that can force wordline 310 to the de-select boosted low voltage Vnwl in response to a disable signal WLDIS.

Having described the general components of the detailed embodiment of FIG. 3, the operation of the embodiment will now be described with reference to FIG. 4 in conjunction with FIG. 3.

Figure 4:
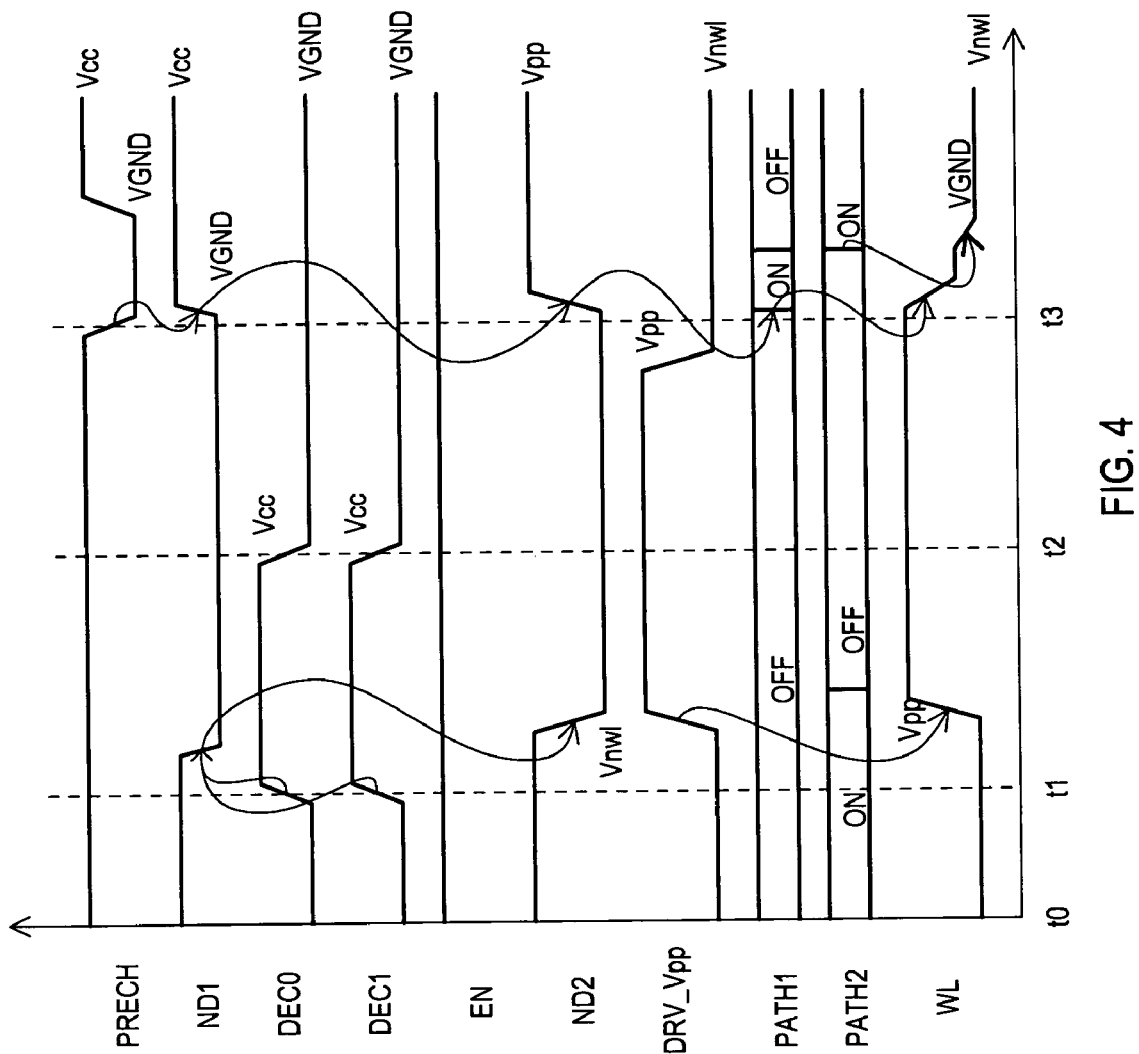
FIG. 4 is a timing diagram showing the operation of the wordline driver circuit of FIG. 3.

FIG. 4 is a timing diagram showing various waveforms corresponding to signals shown in FIG. 3. In addition, FIG. 4 includes waveform "PATH1" representing the operation of first discharge path 308-0 and "PATH2" representing the operation of second discharge path 308-1. Waveform WL represents the response of wordline 310.

At time t0, wordline driver circuit 300 can be a pre-charge (de-selected) state. As a result, wordline 310 can be clamped at boosted low voltage Vnwl by operation of PATH2.

At time t1, according to decode signals DEC0 and DEC1, wordline 310 is selected. Consequently, a discharge path for node ND1 is formed through NFET stack N1/N2/N3 to low voltage VGND, and node ND1 is driven toward VGND. Level shift circuit 304 can level shift the low potential at node ND1 to a boosted low potential at node ND2. A boosted low potential at node ND2 can turn on driver PFET P5 and turn off driver NFET N8. With driver PFET P5 turned on, decoded drive signal DRV_Vpp can drive wordline WL to a boosted high voltage Vpp.

In this way, a selected wordline WL can be driven to a boosted high voltage Vpp.

At time t2, decoded signals can return to inactive levels.

At time t3, a wordline driver circuit 300 can return to a precharge state. Precharge signal PRECH can transition low, turning on PFET P1, thus charging node ND1 to a first high voltage Vcc. In this way, precharge operations occur at a supply voltage (e.g., Vcc), rather than a boost high voltage Vpp, and thus not impact a Vpp supply.

In response to the high voltage at node ND1, voltage translator 304 can drive node ND2 to a boosted high voltage Vpp. This can enable first discharge path PATH1, resulting in wordline WL being pulled toward first low voltage VGND. Subsequently, second discharge path PATH2 can be enabled, resulting in wordline WL being pulled to the boosted low voltage Vnwl.

In this way, a selected wordline WL can be driven first to a low voltage Vss, and then further to a boosted low voltage Vnwl, alleviating current spikes on a boosted low voltage supply.

The embodiment of FIG. 3 shows a preferred arrangement in which wordline discharge can be "self-timed", using the diode-connected discharge path (308-0). However, a separately timed discharge path can be implemented using a separate, external timing circuit that interfaces with the driver as shown in FIG. 3. An example of such an arrangement is shown in FIG. 5.

Figure 5:
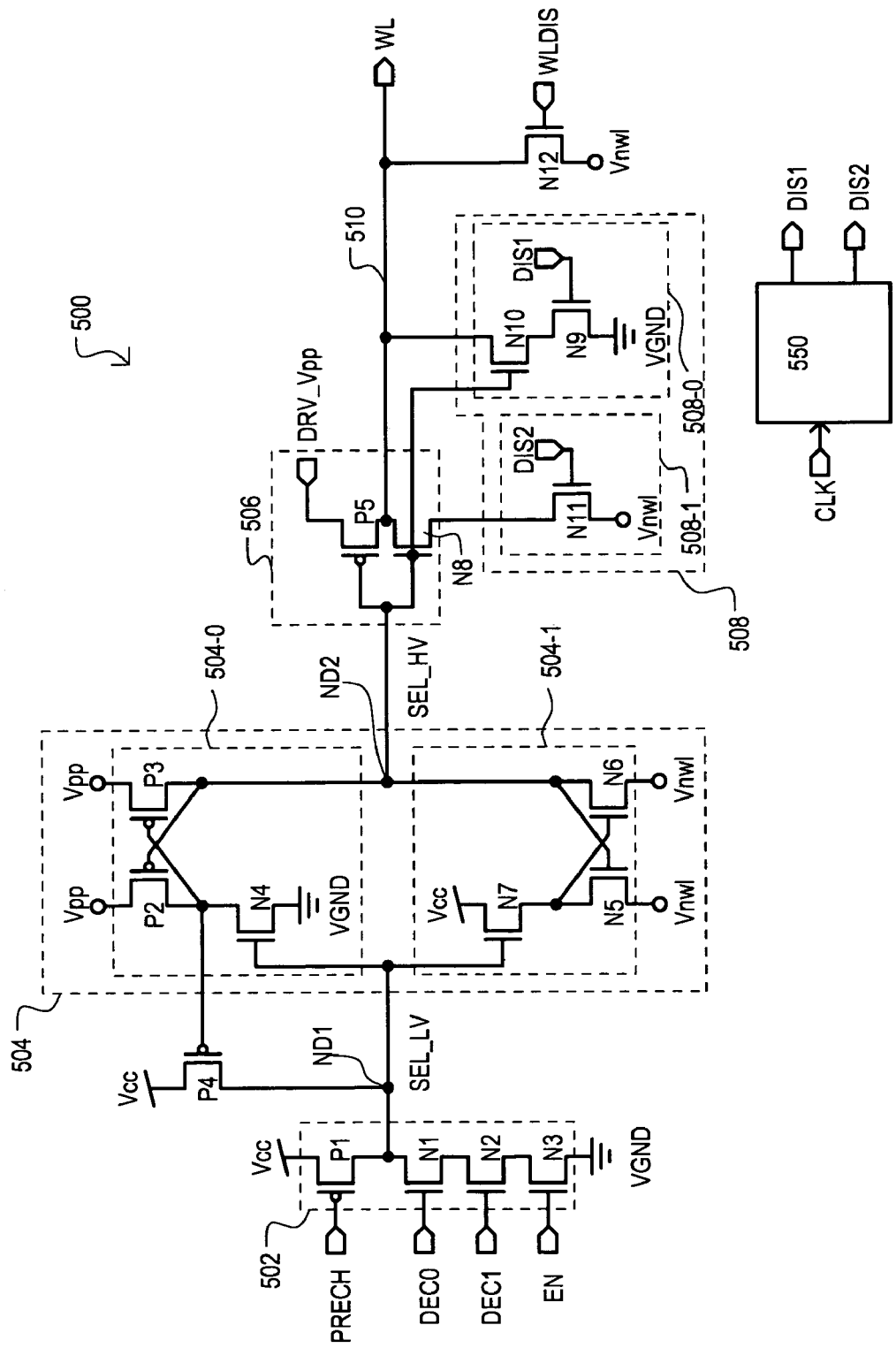
FIG. 5 is a block schematic diagram of a wordline driver circuit according to a fourth embodiment of the present invention.

Referring now to FIG. 5, a fourth embodiment of the present invention is set forth in a schematic diagram and designated by the general reference character 500. A fourth embodiment 500 can include some of the same general circuit sections as the third embodiment. Such like sections are referred to by the same reference character but with the first digit being a "5" instead of a "3". The embodiment of FIG. 5 can be considered related to the embodiment of FIG. 2, in that any of the like sections in FIG. 5 can be detailed examples of those shown in FIG. 2.

FIG. 5 can vary from the embodiment of FIG. 3, in that two discharge paths 508-0 and 508-1 can be enabled in response discharge signals DIS1 and DIS2, respectively. Further, such discharge signals (DIS1 and DIS2) can be enabled in response to a clock signal CLK by a timing circuit 550. A clock signal CLK can be an externally received clock or a signal generated by a memory device in response to some other input signals.

In this way, external discharge operations can be controlled according to an external clock or other generated signal, instead of being self-timed, as is the case of FIG. 5.

Figure 6:
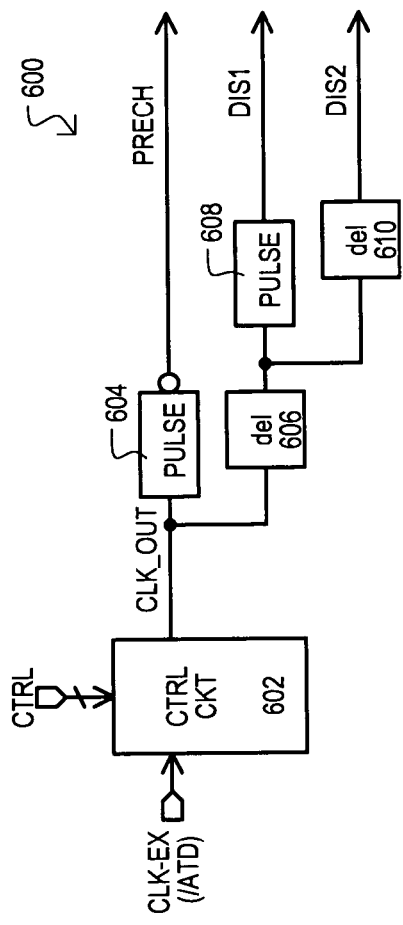
FIG. 6 is a block schematic diagram of a timing control circuit that can be used in the embodiment of FIG. 5.

Referring now to FIG. 6, one example of a timing circuit like that shown as 550 in FIG. 5 is set forth in a block schematic diagram and designated by the general reference character 600. A timing circuit 600 can include logic 602, that can receive an input timing signal and provide an output timing signal CLK_OUT. An input timing signal can be based on an externally received clock signal CLK_EX. Alternatively, in the case of an asynchronous memory device, an input timing signal can event based, such as an inverted address transition detect signal/ATD. Generation of a timing signal can be based on control signals CTRL. Control signals can be generated in response to other input signals of a memory device.

A precharge signal PRECH can be generated with a pulse generator 604. According to well understood techniques, a pulse generator 604 can generate a low going pulse based on a transition in output timing signal CLK_OUT.

To generate discharge signals DIS1 and DIS2, output timing signal CLK_OUT can be delayed by delay circuit 606. First discharge signal DIS1 can then be generated with a pulse generator 608. Second discharge signal DIS2 can be generated with delay circuit 610. Preferably, delay circuit 610 can delay the activation of second discharge signal DIS2 until first discharge signal DIS1 has returned to an inactive level, or anytime thereafter.

In this way, two-stage discharge can be timed according to externally received signals.

A wordline driver circuit according to the various embodiments can be advantageously utilized in memory devices in which relatively low voltage data signals need to be detected. In particular, the embodiments can be utilized in small-dimension, dual voltage level wordline DRAM devices.

Figure 7:
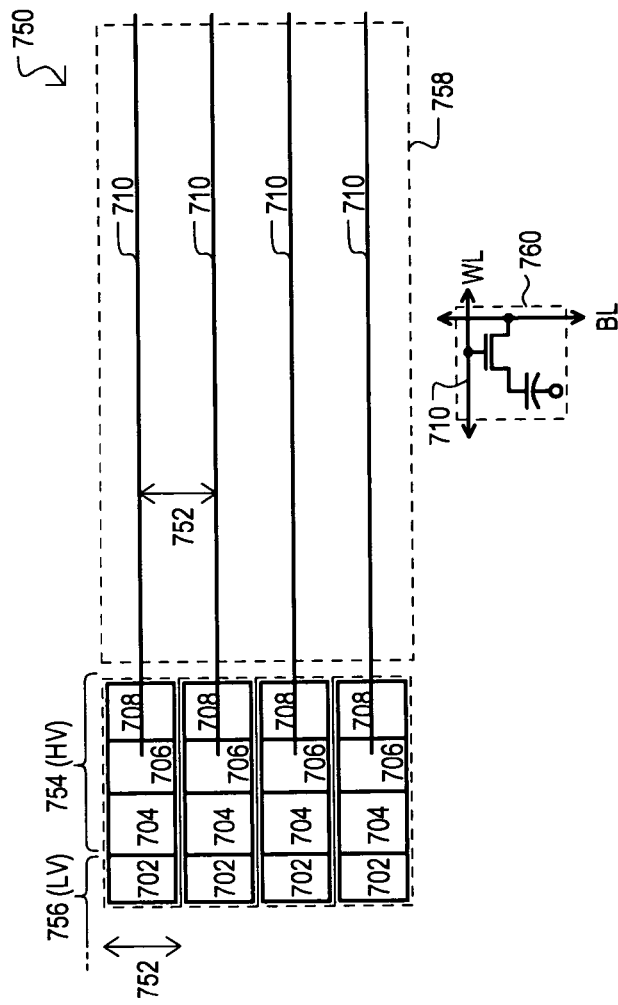
FIG. 7 is a top plan view of a dynamic random access memory (DRAM) memory device according to an embodiment of the present invention.

One very particular arrangement is shown in FIG. 7. FIG. 7 is a top plan view showing a DRAM array 750. A DRAM array 750 can be related to the above embodiments in that any of the disclosed wordline driver circuits can be included in the DRAM array 750. A DRAM 750 array can include some of the same general circuit sections as the first embodiment of FIG. 1 in a repeated fashion. Such like sections are referred to by the same reference character but with the first digit being a "7" instead of a "1".

FIG. 7 shows one very particular example of how sections of wordline driver circuits can fit within a wordline pitch. That is, each wordline 710 can be separated from an adjacent wordline by pitch 752, which extends in a direction perpendicular direction to the wordlines. For each such wordline, wordline driver circuits 700 sections (702, 704, 706 and 708) can fit within such a pitch measurement.

Further, FIG. 7 shows how such wordline driver circuits 700 can include a high voltage circuit section 754 and low voltage section 756. A high voltage section can be routed with high voltage signals (e.g., Vpp and Vnwl). In contrast, low voltage section 756 (which includes decoder 702) can operate at a lower "core" voltage (e.g., with Vcc and VGND).

Wordlines 710 can be coupled to an array 758 composed of a matrix of DRAM cells, one of which is shown as 760. Each DRAM cell 760 can be coupled to a wordline 710 and a bit line BL.

Figure 8:
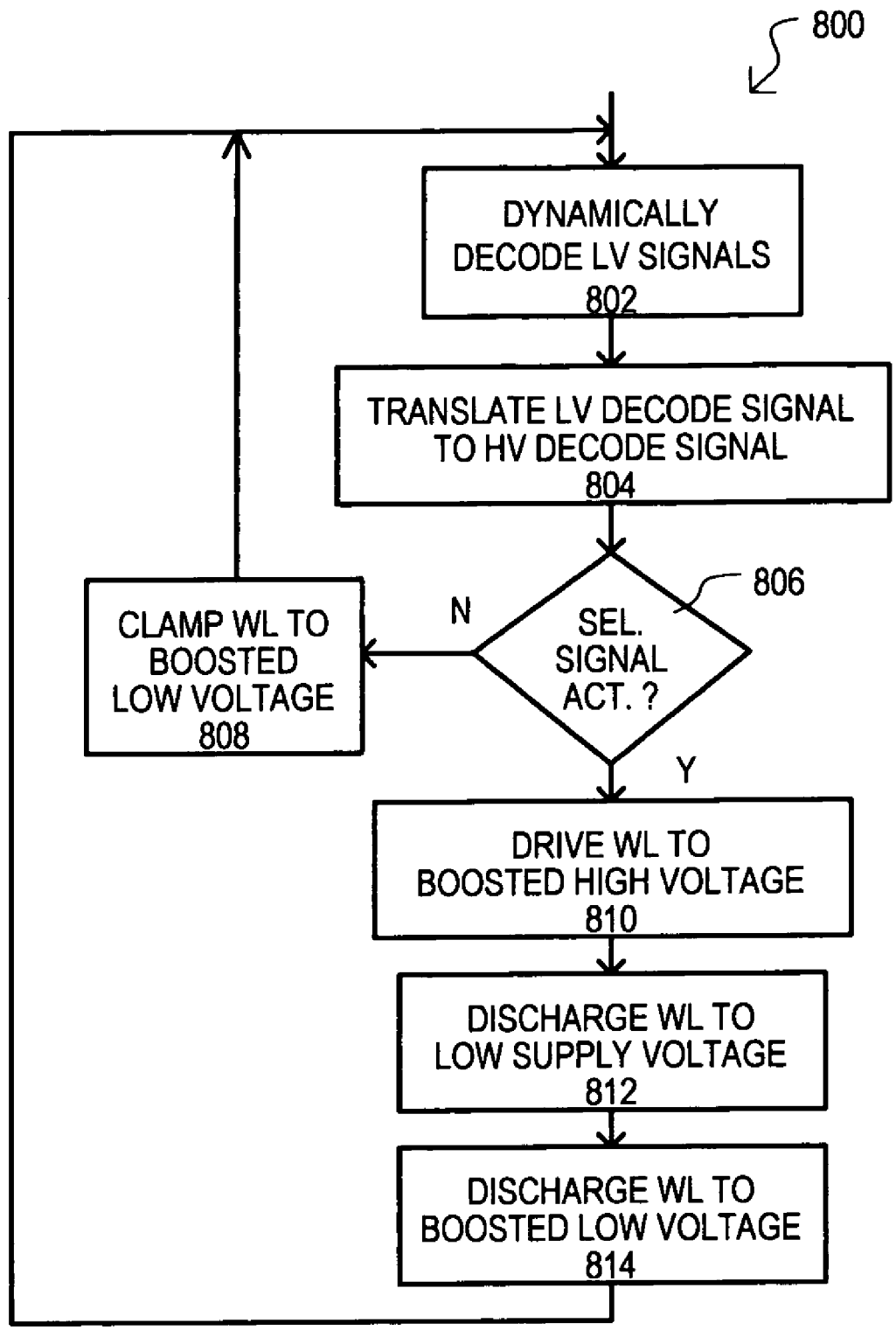
FIG. 8 is a flow diagram showing a method of driving a wordline according to an embodiment of the present invention.
Figure 9:
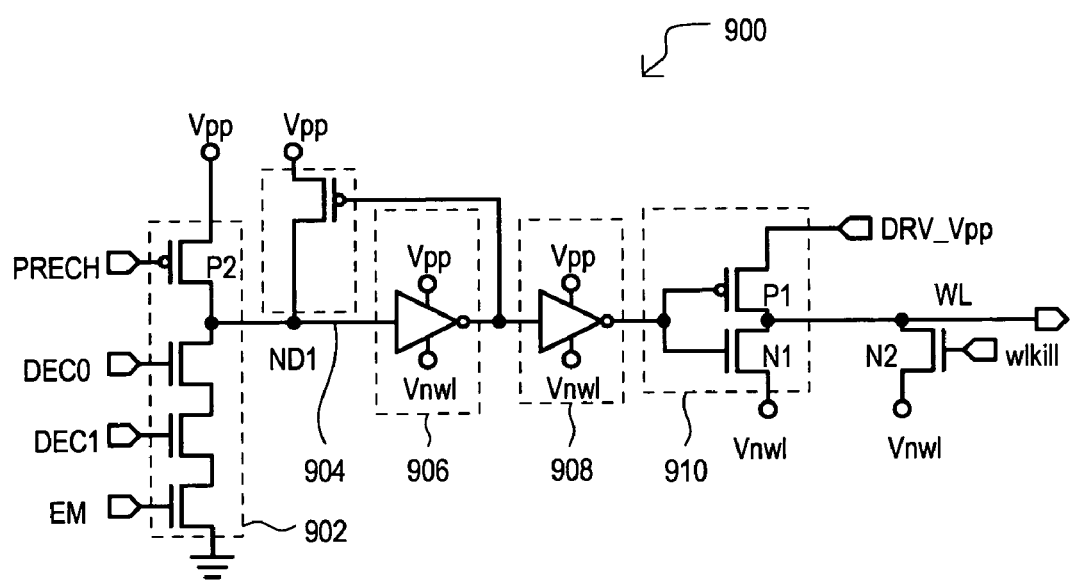
FIG. 9 is a blocks schematic diagram of a conventional wordline driver circuit.

While the above embodiments have shown various examples of wordline driver circuits, the present invention can also include methods of driving wordlines as described above. One example of a wordline driver circuit method according to an embodiment is set forth in FIG. 8, and designated by the general reference character 800.

A method 800 can include dynamically decoding a select signal with low voltage levels (step 802). Such a low voltage decode signal can then be translated to a high voltage (step 804). In the event the decode result is not active (N from 806), a wordline can be clamped to a boosted low voltage (step 808).

In the event the decode result is active (Y from 806), a wordline can be driven to a boosted high voltage (step 810). A wordline can then be discharged toward a first low supply voltage (step 812). A wordline can then be further discharged toward a boosted low supply voltage (step 814).

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A memory device circuit, comprising:
    a plurality of wordlines, each having a plurality of volatile memory cells coupled thereto; and
    a plurality of level shift circuits, one level shift circuit coupled to one corresponding wordline, each level shift circuit translating an input signal at a decode node that transitions between a first high voltage level and a first low voltage level to an output signal that transitions between a second high voltage level and second low voltage level, the second high voltage being higher than the first high voltage, the second low voltage being lower than the first low voltage; and
    a discharge circuit coupled to each wordline, each discharge circuit including a first discharge path that provides a first current path between at least one wordline and the first low voltage level and a second discharge path that provides a second current path between the at least one wordline and the second low voltage level, the second discharge path being enabled after the first discharge path is enabled, in a precharge operation.

2. The memory device circuit of claim 1, wherein:
    each level shift circuit includes
        a high level shift section that receives the second high voltage level and the first low voltage level and translates the input signal to the second high voltage level, and
        a low level shift section that receives the first high voltage level and the second low voltage level and translates the input signal to the second low voltage level.

3. The memory device circuit of claim 2, wherein:
    each high level shift section comprises cross coupled first and second translator p-channel insulated gate field effect transistors (PFETs), each having a source coupled to the second high voltage level, the drain of the second translator PFET being coupled to a translator output node that provides the translated output signal.

4. The memory device circuit of claim 2, wherein:
    each low level shift section comprises cross coupled first and second translator n-channel insulated gate field effect transistors (NFETs), each having a source coupled to the second low voltage level, the drain of the second translator NFET being coupled to a translator output node.

5. The memory device circuit of claim 1, wherein:
    each volatile memory cell comprises a dynamic random access memory (DRAM) cell having an n-channel insulated gate field effect transistor having a gate coupled to a corresponding wordline and a source coupled to a storage capacitor.

6. The memory device circuit of claim 1, wherein:
    the first discharge path includes
        a first discharge transistor having a source-drain path coupled between the at least one wordline and the first low voltage level and a gate coupled to receive the translated output signal, and
        a second discharge transistor having a source-drain path coupled in series with the source-drain path of the first discharge transistor, and a gate coupled to the at least one wordline.

7. The memory device circuit of claim 1, wherein:
    the second discharge path includes
        a boost discharge transistor having a source-drain path coupled between the at least one wordline and the second low voltage level, and
        a discharge driver having an input coupled to the at least one wordline and an output coupled to the gate of the boost discharge transistor, the discharge driver driving the gate of the boost discharge transistor between the second high voltage level and the second low voltage level.

8. The memory device circuit of claim 1, wherein:
the first discharge path includes
- a first discharge transistor having a source-drain path coupled between the at least one wordline and the first low voltage level and a gate coupled to receive the translated output signal, and
- a second discharge transistor having a source-drain path coupled in series with the source-drain path of the first discharge transistor, and a gate coupled to receive a first discharge signal.

9. The memory device circuit of claim 8, wherein:
the second discharge path includes a boost discharge transistor having a source-drain path coupled between the at least one wordline and the second low voltage, and a gate coupled to receive a second discharge signal that is activated after the first discharge signal in a precharge operation.

10. The memory device circuit of claim 9, further including:
- a clock circuit that receives at least one external timing signal and generates the first discharge signal and second discharge signal in response to the external timing signal.

\* \* \* \* \*